United States Patent [19]

Daum

[11] Patent Number: 4,621,305

[45] Date of Patent: Nov. 4, 1986

[54] HEADER CONNECTOR AND ATTACHMENT

[75] Inventor: Ronald E. Daum, Warren, Ohio

[73] Assignee: General Motors Corporation, Detroit, Mich.

[21] Appl. No.: 643,160

[22] Filed: Aug. 22, 1984

[51] Int. Cl.[4] .................................... H05K 1/00

[52] U.S. Cl. ........................ 361/398; 339/17 F; 361/400; 361/413

[58] Field of Search .............. 339/17 C, 17 CF, 17 F, 339/91 R, 176 M, 176 MF; 361/392, 395, 398, 400, 403, 412, 413, 415, 426

[56] References Cited

U.S. PATENT DOCUMENTS

| | | | |
|---|---|---|---|
| 3,159,447 | 12/1964 | Crimmins et al. | 339/176 |
| 3,652,973 | 3/1972 | Doughty | 339/17 |
| 3,663,922 | 5/1972 | Foust et al. | 339/17 |
| 4,087,146 | 5/1978 | Hudson, Jr. | 339/17 F |
| 4,293,177 | 10/1981 | Weinsenburger | 339/99 |
| 4,295,696 | 10/1981 | Gray | 339/17 |
| 4,406,511 | 9/1983 | Hayes | 339/103 |
| 4,439,000 | 3/1984 | Kaufman et al. | 339/176 MP |

FOREIGN PATENT DOCUMENTS

| | | | |
|---|---|---|---|
| 2341770 | 8/1983 | Fed. Rep. of Germany | 339/176 MP |

*Primary Examiner*—A. D. Pellinen
*Assistant Examiner*—Gregory D. Thompson
*Attorney, Agent, or Firm*—Saul Schwartz

[57] ABSTRACT

A header connector and attachment thereof to a flexible printed circuit substrate having a plurality of exposed circuit end segments. The header connector includes a connector having a plurality of bores therethrough and an outrigger rigidly attached to the connector in parallel, laterally spaced relation so that an open span is defined between the connector and the outrigger. Male pin terminals have long leg portions wedged into the bores in the connector and have short leg portions bent at about 90° to the long leg portions. The short leg portions extend across the open span to the outrigger and are received in slots in the outrigger which align the short leg portions parallel to each other. Projections on the outrigger at opposite ends thereof are received in apertures in the substrate so that the connector and outrigger are aligned on the substrate. Splice clips are inserted into the substrate from below the open span and include tabs which are crimped around respective ones of the short leg portions so that the substrate and circuit end segments are pressed against the short leg portions.

5 Claims, 5 Drawing Figures

HEADER CONNECTOR AND ATTACHMENT

BACKGROUND OF THE INVENTION

1. Field of the Invention

This invention relates generally to electrical connectors and, more particularly, to a new and improved header connector and attachment thereof to a flexible printed circuit substrate.

2. Description of the Prior Art

In many printed circuit applications, a male-pin header connector provides a junction between a number of the circuit paths defined on the printed circuit substrate and a female-pin connector defining the termination of a number of remote conductors. When the printed circuit substrate is flexible, the problems of establishing electrical continuity between the male-pin terminals and the circuits on the substrate and protecting the connections against strain are especially difficult. With respect to electrical continuity, header connectors have been proposed wherein an edge of the flexible printed circuit substrate is inserted into the connector and contacts thereon are resiliently biased against exposed portions of the circuits. Another proposed header connector has a connector body fabricated in separate upper and lower halves. A portion of a flexible substrate containing a plurality of parallel conductors is stripped away to expose the conductors. To connect the conductors to a plurality of pin terminals on the lower connector half, the exposed conductors are aligned by guides on the lower connector half over open receiving passageways on the pin terminals. The upper connector half is then clamped over the lower connector half and forces the exposed conductors into the open receiving passageways of the pin terminals to establish continuity between the conductors and the pin terminals. With respect to strain relief, some header connector proposals of the edge insertion variety have included outrigger-like clamping bars which clamp around the flexible printed circuit substrate outboard of the connections to the pin terminals to isolate the connections from forces tending to pull the substrate out of the connector. In another proposal, a pair of projections attached to but offset from the connector engage apertures in the flexible printed circuit substrate to effect strain relief. A header connector and attachment according to this invention represents a novel alternative to these and other known header connector and attachment arrangements in that a strain relieved junction between circuits and pin terminals is achieved in a particularly simple and economical manner.

SUMMARY OF THE INVENTION

Accordingly, the primary feature of this invention is that it provides a new and improved header connector and attachment for achieving a strain relieved junction between pin terminals and circuit segments on a flexible printed circuit substrate. Another feature of this invention resides in the provision in the new and improved header connector and attachment of a connector perpendicular to the flexible substrate over the circuits thereon, a pair of outriggers on opposite sides of the connector with open spans between the latter and the outriggers over the circuits, a plurality of L-shaped male-pin terminals with long legs on the connector and short legs parallel to the substrate between the connector and the outriggers, and guides or slots in the outriggers which receive the ends of the male-pin terminal short legs whereby the short legs are aligned with preselected segments of the circuits for connection to the latter by splice clips projecting through the substrate. Still another feature of this invention resides in the provision in the new and improved header connector and attachment of a pair of projections at opposite ends of the outriggers projecting into corresponding apertures in the flexible substrate to align the header connector relative to the circuits on the substrate and to provide strain relief outboard of the interface between the circuits and the male-pin terminal short legs.

BRIEF DESCRIPTION OF THE DRAWINGS

These and other features of this invention will be readily apparent from the following specification and from the drawings wherein.

DETAILED DESCRIPTION OF THE PREFERRED EMBODIMENT

Figure 1:
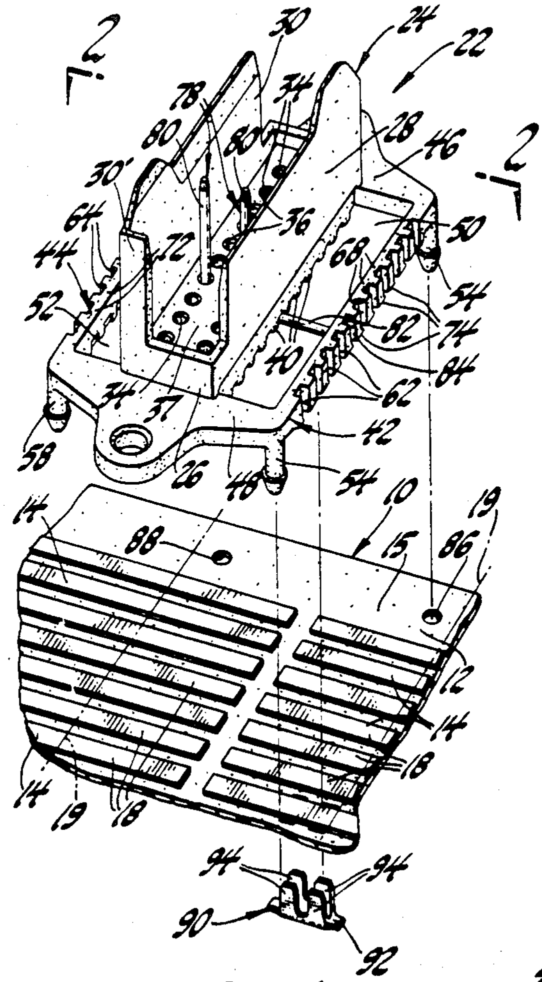
FIG. 1 is an exploded perspective view of the header connector and attachment according to this invention.

Referring now to FIG. 1 of the drawings, a partially and schematically illustrated printed circuit 10 includes a flexible substrate 12 with a plurality of electrical circuits 14 formed on or near a top surface 15 thereof. The circuits 14 are conventionally insulated from each other by being, for example, embedded within the substrate 12 or covered with a layer of insulating material. The circuits 14 are routed to a convenient location on the substrate whereat a plurality of parallel end segments 18 are exposed, such as by removal of insulation schematically illustrated by edge lines 19. The circuits 14 interface with a female-pin connector, not shown, defining the termination of a plurality of remote conductors, which may be a part of a vehicle wiring harness, through a header connector and attachment according to this invention and designated 22.

With particular reference to FIGS. 1 through 4, the header connecto and attachment 22 includes a header connector 24 having a base 26, a first relatively thin side wall 28 on one side of and integral with the base, and a second relatively thin side wall 30 likewise integral with the base and located on the opposite side thereof. The side walls 28 and 30 each include integral L-shaped flange portions 28' and 30', respectively, at opposite ends of the connector 24 for polarization of the female-pin connector, not shown.

Figure 2:
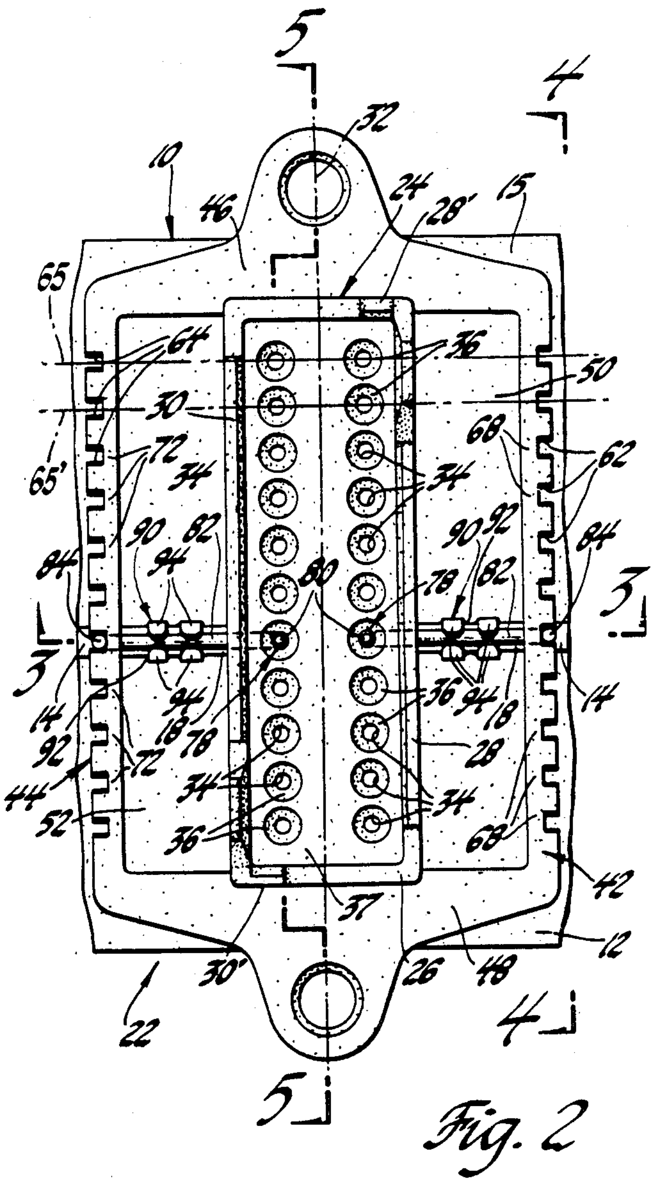
FIG. 2 is an enlarged view, with parts assembled, taken generally along the plane indicated by lines 2—2 in FIG. 1.
Figure 3:
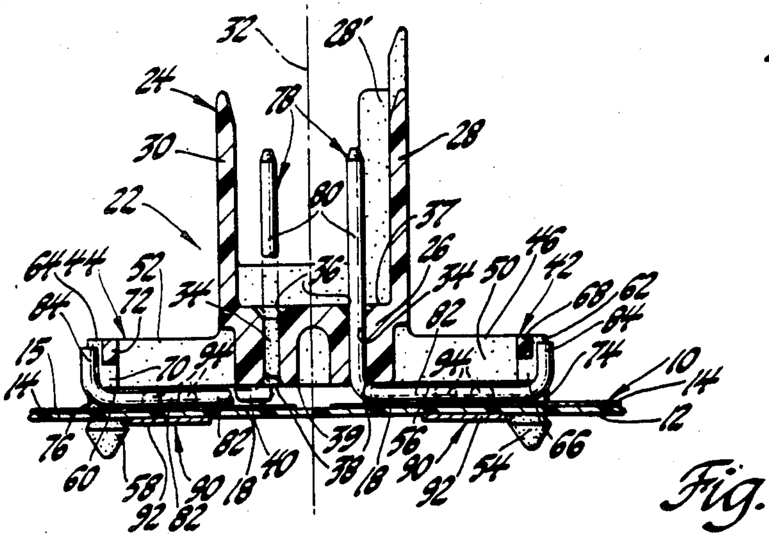
FIG. 3 is a sectional view taken generally along the plane indicated by lines 3—3 in FIG. 2.
Figure 4:
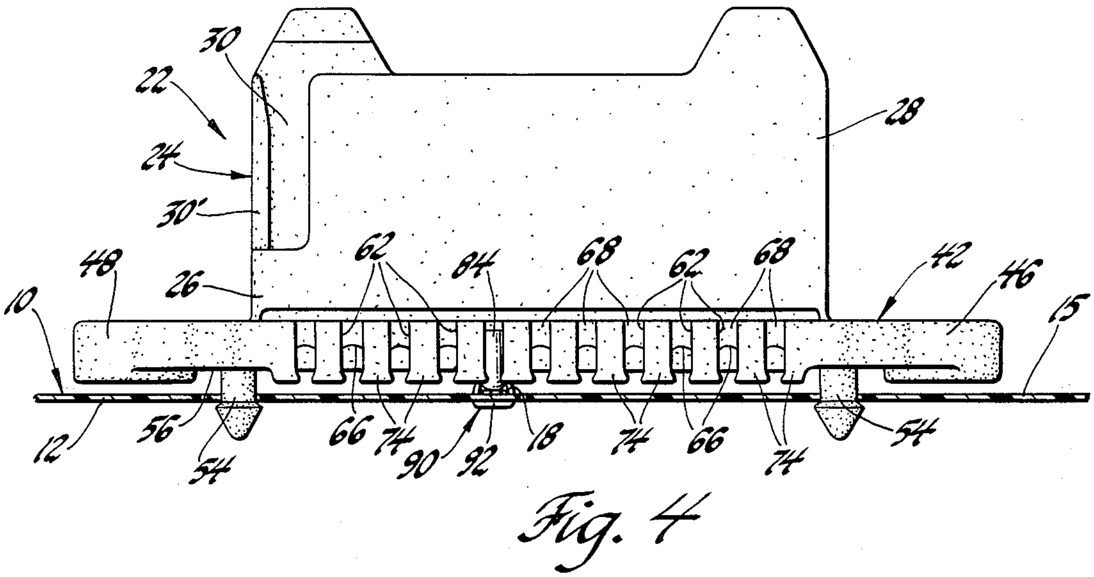
FIG. 4 is a view taken generally along the plane indicated by lines 4—4 in FIG. 2.
Figure 5:
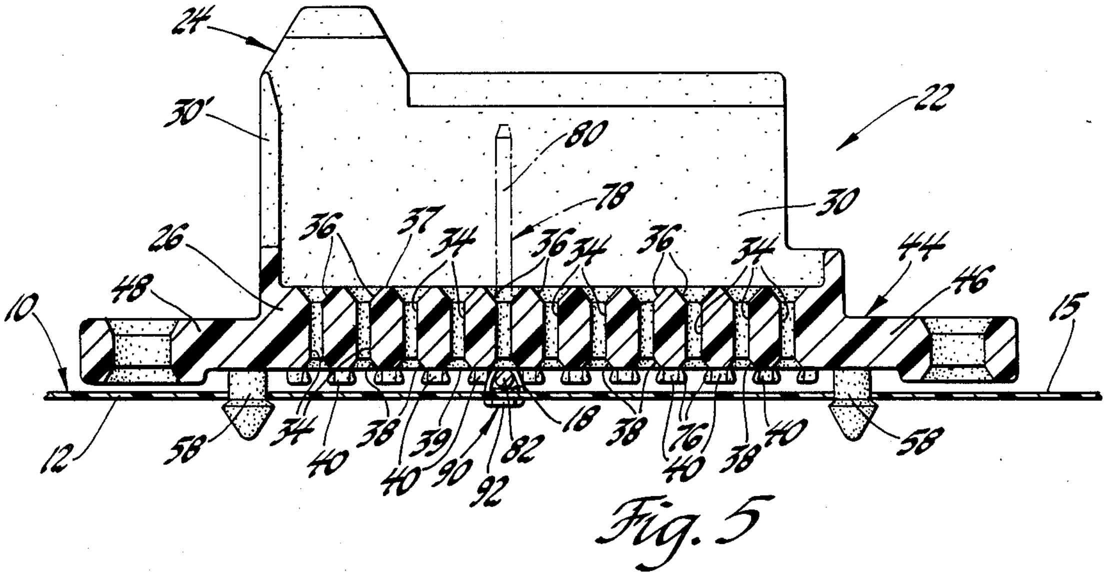
FIG. 5 is a sectional view taken generally along the plane indicated by lines 5—5 in FIG. 2.

As seen best in FIGS. 2, 3 and 5, the connector 24 has a longitudinal plane of symmetry 32 and a plurality of cylindrical bores 34 arranged in pairs in two parallel rows on opposite sides of the plane of symmetry 32. Each of the bores 34 is countersunk at 36 on an upwardly facing surface 37 of the base 26 and at 38, FIG. 5, on a lower or downward facing surface 39 of the base 26. On the lower surface 39, each of the countersunk bores 34 is separated from the next adjacent one of the countersunk bores by a raised pad 40, FIGS. 3 and 5, integral with the base 26.

As seen best in FIGS. 1 through 4, a first outrigger 42 is disposed parallel to and laterally spaced from the connector 24 on one side of the latter and an identical second outrigger 44 is disposed on the opposite side thereof symmetrical with respect to plane 32. A first cross member 46 integral with each of the outriggers 42 and 44 and the connector 24 rigidly attaches the outriggers at respective first ends to the connector and a similar second cross member 48, likewise integral with the outriggers and the connector, rigidly attaches the opposite ends of the outriggers to the connector. A pair of open spans 50 and 52, FIGS. 1, 2 and 3, are thus defined between the connector 24 and the first and second outriggers 42 and 44, respectively.

A pair of projections 54 at opposite ends of the outrigger 42 and integral therewith project down below a lower surface 56 of the outrigger coplanar with the lower surface 39 of the connector. A similar pair of projections 58 at opposite ends of and integral with the outrigger 44 project down below a lower surface 60 of the latter coplanar with the lower surface 39. A plurality of evenly spaced vertical slots 62 on the outboard side of outrigger 42 and an identical plurality of evenly spaced vertical slots 64 on the outboard side of outrigger 44 are aligned in pairs in a plurality of transverse planes, such as planes 65 and 65; FIG. 2, containing pairs of the cylindrical bores 34. A plurality of evenly spaced horizontal slots 66 in the lower surface 56 of the outrigger 42 intersect respective ones of the vertical slots 62 thereby cooperating with the latter in defining a plurality of narrow bridge sections 68 along the length of the outrigger. A corresponding plurality of evenly spaced horizontal slots 70 in the lower surface 60 of outrigger 44 intersect respective ones of the vertical slots 64 so that a similar plurality of bridge sections 72 are defined along the length of the outrigger 44. The sides of each of the vertical slots 62 in the outrigger 42 converge at their lower ends and cooperate in defining a plurality of relatively flexible gates 74. Similarly, the sides of each of the vertical slots 64 in the outrigger 44 converge at their lower ends and cooperate in defining a plurality of relatively flexible gates 76.

The connector 24 includes a plurality of L-shaped cylindrical male-pin terminals 78, only one pair being shown, each having a vertical or long leg 80 in one of the bores 34 and a horizontal or short leg 82 bridging one of the spans 50 and 52 between the base 26 and the outriggers 42 and 44, respectively. The short legs 82 extend from the bores 34, between adjacent pairs of the raised pads 40 on the lower surface 39 of the base, and through the horizontal slots below the bridge sections 68 and 72 in the outriggers 42 and 44, respectively. Each short leg 82 has an upturned end 84 in one of the vertical slots 62 and 64 on the outboard sides of the outriggers. The short legs 82 are thus guided or aligned by the horizontal slots 66 and 70 and the vertical slots 62 and 64 in parallel relation to each other across the spans 50 and 52.

Describing, now, the attachment of the connector 24 to the printed circuit 10, the flexible substrate 12 of the latter has formed therein four locating/relief apertures, only two such apertures 86 and 88 being shown in FIG. 1, located in precise relation to the circuit end segments 18. The pair of the locating/relief apertures represented by aperture 86 receives the projections 54 at opposite ends of the outrigger 42 when the connector is positioned over the end segments and the other pair of locating/relief apertures represented by aperture 88 similarly closely receive projections 58 at opposite ends of the outrigger 44. The locating/relief apertures thus cooperate with the projections 54 and 58 in locating the connector relative to the end segments 18 such that the open spans 50 and 52 are above the end segments 18 and the short legs 82 of each of the male-pin terminals 78 are located parallel to, above, and in contact with one of the end segments 18.

Electrical continuity is established and maintained between each of the end segments 18 and a corresponding one of the short legs 82 of the male-pin terminals by a corresponding plurality of splice clips 90, only one pair being shown. Each of the splice clips has a generally U-shaped body 92 from which project two pairs of laterally spaced tabs 94. The tabs 94 have distal ends configured for piercing the flexible substrate 12 and project through the latter on opposite sides of the short legs below the open spans 50 and 52. Each of the tabs 94 is wrapped or crimped around one of the short legs 82 thereby capturing each of the end segments 18 between the substrate and one of the short legs 82 of the male-pin terminals. Because the tabs 94 are tightly crimped, electrical continuity is established and permanently maintained between the terminals 78 and the end segments 18.

In the preferred embodiment, the connector 24, the outriggers 42 and 44, and the cross members 46 and 48 are molded as a unit from a commercially available electrically insulating polymer. The male-pin terminals 78 are initially unbent and inserted in the bores 34 until upsets, not shown, on the long legs 80 wedge into the bores to secure the terminals on the connector. In a second operation, the upturned ends 84 are formed and then the male-pin terminals are bent generally about 90° to form the short legs 82. As the short legs 82 approach 90° relative to the long legs 80, each snaps through one of the gates 74 and 76 at the lower ends of the vertical slots 62 and 64, respectively. The short legs 82 are thereby precisely aligned in parallel spaced relation to each other. In a third operation, the connector 24 with male-pin terminals 78 installed is postioned against the top surface 15 of the flexible substrate with the projections 54 and 58 extending into the locating/relief apertures thereby aligning the short legs 82 with the circuit end segments 18. All of the splice clips 90 are then simultaneously installed from below the substrate 12. A crimping tool, not shown, applied through the open spans 50 and 52, tightly wraps each of the tabs 94 over one of the short legs 82 so that the flexible substrate is squeezed between the U-shaped bodies of the clips and the short legs 82 and the circuit end segments 18 are thereby pressed against the short legs.

The male-pin terminals 78 may be connected to a plurality of external conductors through female-pin terminals in a connector body, not shown, adapted to mate with connector 24. The flexible nature of the printed circuit 10 renders the connections at the splice clips 90 vulnerable to strain if the connector 24 is held stationary and pulling forces are applied to the flexible substrate or vice-versa. The projections 54 and 58, however, being located outboard of the splice clip connections, operate to bypass the connections and transfer strain directly to the connector 24.

While the preferred embodiment of the connector and attachment 22 is illustrated as including male-pin terminals 78, female-pin terminals could be employed. Likewise, while the long legs 80 are oriented perpendicular to the flexible substrate 12, they could be arranged parallel to the latter. In addition, various end configurations on the short legs 82 in combination with various socket configurations on the outriggers are possible whereby the short legs are guided to and arranged in parallel relation across the spans between the connector and the outriggers. And, of course, while the preferred embodiment has two outriggers located on opposite sides of the connector, other applications might require only one outrigger.

The embodiments of the invention in which an exclusive property or privilege is claimed are defined as follows:

1. In combination with a printed circuit including a flexible substrate having a plurality of conductive circuits thereon defining a plurality of exposed end segments, a header connector and attachment comprising, a connector having a plurality of terminal support means thereon, an outrigger, means rigidly connecting said outrigger to said connector in laterally spaced parallel relation thereto so that an open span is defined between said connector and said outrigger, means locating said connector relative to said substrate whereby said open span is over said circuit end segments, a plurality of pin terminal means in said terminal support means each including a short leg extending between said connector and said outrigger, guide means on said outrigger engaged on a distal end of each of said short legs aligning each of said short legs parallel to and over corresponding ones of said circuit end segments, and a plurality of splice clips below said open span each having tabs projecting through said substrate and wrapped around a corresponding one of said short legs whereby said substrate is forced against said corresponding short leg with one of said circuit end segments below and parallel to said corresponding one of said short legs captured therebetween.

2. The connector and attachment recited in claim 1 wherein said means locating said connector relative to said substrate includes a pair of projections rigidly connected to said connector laterally outboard of the interfaces between said splice clips and said pin terminal means short legs, and a corresponding pair of apertures in said substrate receiving respective ones of said projections so that said connector is located relative to said circuit end segments and the interfaces between said splice clips and said pin terminal means short legs are strain relieved.

3. The connector and attachment recited in cliam 1 wherein said guide means on said outrigger includes means defining a plurality of evenly spaced slots in a surface of said outrigger each receiving one of said short leg distal ends whereby said short legs are located parallel to each other across said open span.

4. The connector and attachment recited in claim 3 wherein each of said plurality of pin terminal means is a cylindrical pin including a long leg attached to said connector by said terminal support means and integral with said short leg, said short leg being oriented at about 90° relative to said long leg.

5. In combination with a printed circuit including a flexible substrate having a plurality of conductive circuits thereon defining a plurality of exposed end segments, a header connector and attachement comprising, a connector having a plurality of bores therethrough, an outrigger, means integral with said connector and said outrigger rigidly attaching said outrigger to said connector in laterally spaced parallel relation to said connector so that an open span is defined between said connector and said outrigger, means defining a pair of apertures in said substrate, means defining a pair of projections on said outrigger at opposite ends thereof received in corresponding ones of said apertures whereby said open span is located over said circuit end segments, a plurality of cylindrical male-pin terminals each having a long leg wedged into one of said bores in said connector whereby said terminals are supported on said connector and an integral short leg oriented at about 90° to said long leg and extending between said connector and said outrigger, means defining an upturned end at a distal end of each of said short legs, means on said outrigger defining a plurality of evenly spaced slots in a lower surface of said outrigger and a corresponding plurality of slots in a laterally outboard surface of said outrigger intersecting respective ones of said lower surface slots, each of said short legs being received in one of said lower surface slots whereby said short legs are aligned parallel to each other and parallel to and over corresponding ones of said circuit end segments and each of said upturned ends being received in a corresponding one of said outboard surface slots, means on said outrigger defining a flexible gate at a lower end of each of said outboard surface slots through which portions of respective ones of said short legs are received, and a plurality of splice clips below said open span each having integral tabs projecting through siad substrate and wrapped around a corresponding one of said short legs whereby said substrate is forced against said corresponding short leg with one of said circuit end segments below and parallel to said corresponding one of said short legs captured therebetween.

* * * * *